(12) United States Patent
Norgren et al.

(10) Patent No.: US 12,390,861 B2
(45) Date of Patent: Aug. 19, 2025

(54) COATED CUTTING TOOL

(71) Applicant: AB SANDVIK COROMANT, Sandviken (SE)

(72) Inventors: Susanne Norgren, Vastberga (SE); Bartek Kaplan, Vastberga (SE)

(73) Assignee: AB Sandvik Coromant, Sandviken (SE)

( * ) Notice: Subject to any disclaimer, the term of this patent is extended or adjusted under 35 U.S.C. 154(b) by 820 days.

(21) Appl. No.: 17/415,434

(22) PCT Filed: Dec. 19, 2019

(86) PCT No.: PCT/EP2019/086238
§ 371 (c)(1),
(2) Date: Jun. 17, 2021

(87) PCT Pub. No.: WO2020/127684
PCT Pub. Date: Jun. 25, 2020

(65) Prior Publication Data
US 2022/0023954 A1    Jan. 27, 2022

(30) Foreign Application Priority Data

Dec. 20, 2018  (EP) ..................................... 1821450

(51) Int. Cl.
*B23B 27/14* (2006.01)
*B22F 3/16* (2006.01)
(Continued)

(52) U.S. Cl.
CPC .............. *B23B 27/14* (2013.01); *B22F 3/164* (2013.01); *B22F 5/00* (2013.01); *C23C 14/0635* (2013.01);
(Continued)

(58) Field of Classification Search
None
See application file for complete search history.

(56) References Cited

U.S. PATENT DOCUMENTS 5,484,468 A *   1/1996  Ostlund .................. C22C 29/08
                                                    419/30
6,616,970 B2 *  9/2003  Lenander ................ C22C 29/08
                                                    427/255.391
(Continued)

FOREIGN PATENT DOCUMENTS

EP       1803830 A1       7/2007
JP    2005220363 A        8/2005
(Continued)

OTHER PUBLICATIONS

Luca Boccarusso et al: "Effects of Cr3C2 Addition of Wear Behaviour pf WC-Co Based Cemented Carbides", Metals, vol. 8, No. 11, Nov. 1, 2018, p. 895.

*Primary Examiner* — Seth Dumbris
(74) *Attorney, Agent, or Firm* — Corinne R. Gorski

(57) ABSTRACT

The present invention relates to a coated cutting tool including a Cr-containing cemented carbide substrate having WC, a binder phase and a gamma phase. The cemented carbide includes a gradient surface zone with a thickness of between 2 to 100 µm, which is binder phase enriched and depleted of gamma phase. The cemented carbide includes $M_7C_3$ carbides in an amount of between 0.5 to 7 area % measured in the bulk, where M is elements being Cr, W and at least one binder metal. The coated cutting inserts shows an improved edge line toughness.

14 Claims, 1 Drawing Sheet

Figure 1:
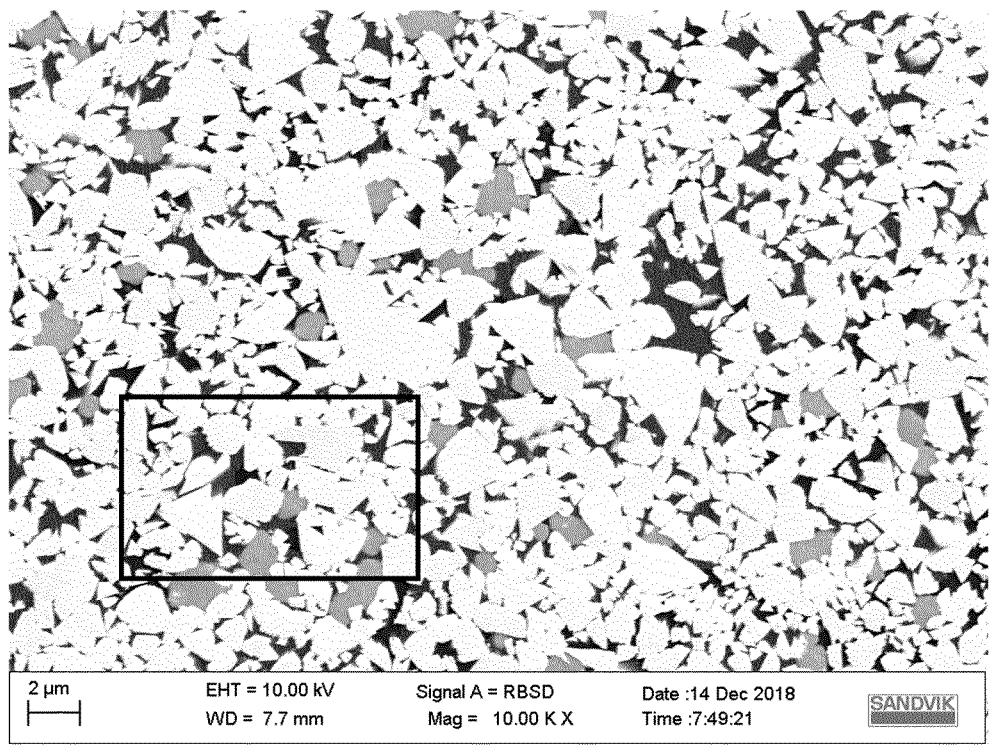

(51) Int. Cl.
  *B22F 5/00* (2006.01)
  *C23C 14/06* (2006.01)
  *C23C 14/58* (2006.01)
  *B22F 1/103* (2022.01)

(52) U.S. Cl.
  CPC .......... *C23C 14/5806* (2013.01); *B22F 1/103* (2022.01); *B22F 2003/166* (2013.01); *B22F 2005/001* (2013.01); *B22F 2302/10* (2013.01); *B22F 2302/20* (2013.01); *B22F 2999/00* (2013.01); *B23B 2224/20* (2013.01); *B23B 2224/28* (2013.01); *B23B 2224/36* (2013.01)

(56) References Cited

U.S. PATENT DOCUMENTS

| | | | | |
|---|---|---|---|---|
| 2004/0009088 | A1* | 1/2004 | Glatzle | ................... C22C 29/08 419/14 |
| 2004/0079191 | A1* | 4/2004 | Kobayashi | .............. C22C 29/08 75/242 |
| 2008/0166580 | A1* | 7/2008 | Selinder | .............. C23C 14/0021 428/548 |

FOREIGN PATENT DOCUMENTS

| | | | | |
|---|---|---|---|---|
| JP | 2005248309 | A | 9/2005 | |
| JP | 2008001918 | A | 1/2008 | |
| WO | WO-2016151025 | A1 * | 9/2016 | ............. C22C 29/06 |
| WO | WO-2017148885 | A1 * | 9/2017 | ................ B22F 3/16 |
| WO | 2018060125 | A1 | 4/2018 | |

* cited by examiner

COATED CUTTING TOOL

RELATED APPLICATION DATA

This application is a § 371 National Stage Application of PCT International Application No. PCT/EP2019/086238 filed Dec. 19, 2019 claiming priority to EP 18214505.2 filed Dec. 20, 2018.

The present invention relates to a coated cutting tool comprising Cr in such amounts that $M_7C_3$ carbides are present in the microstructure.

BACKGROUND

It is well known in the art of making cemented carbide to add Cr to improve properties, such as corrosion resistance and in order to inhibit grain growth of WC. The amount of Cr added to obtain these advantages is usually quite small, well below the solubility limit of Cr in the Co binder.

When the solubility limit is exceeded, $M_7C_3$ carbides form. $M_7C_3$ carbides are more brittle than the binder and considered to be detrimental for many applications and therefore something to avoid.

There is always a strive to improve the performance of the cutting tool in all cutting applications.

One object of the present invention is to improve the edge line toughness in turning applications.

DETAILED DESCRIPTION OF THE INVENTION

The present invention relates to a coated cutting tool comprising a Cr-containing cemented carbide substrate comprising WC, a binder phase and a gamma phase. The cemented carbide comprises a gradient surface zone with a thickness of between 2 to 100 μm which is binder phase enriched and depleted of gamma phase. The cemented carbide comprises $M_7C_3$ carbides in an amount of between 0.5 to 7 area % measured in the bulk where M is elements comprising Cr, W and at least one binder metal.

By $M_7C_3$ carbide is herein meant a carbide, where M is elements comprising Cr, W and at least one binder metal, preferably Fe and/or Co, and possibly minor amounts of one or more of Ti, Ta, Nb, Zr and V depending on the overall composition of the cemented carbide. When Co is the binder, $(Cr,W,Co)_7C_3$ is the most common form.

$M_7C_3$ carbides are the first additional carbide phase formed when the Cr content exceeds the solubility of Cr in the binder. Its crystal structure is orthorhombic, hexagonal or a mixture thereof. In the case where the binder is Co, it is quite common to describe the upper limit for Cr in the binder as a ratio between Cr and Co. An old "rule of thumb" is to not exceed a weight Cr/Co ratio of 0.15. However, the solubility limit of Cr in the binder is also dependent on the overall composition of the cemented carbide.

According to the present invention, the amount of $M_7C_3$ carbide should be within 0.5 to 7 area %, preferably 1.5 to 6 area %. If the amount of $M_7C_3$ carbide becomes too high in the microstructure the fraction of ductile binder phase, usually consisting of Co, is reduced thus generating a more brittle material. However, the exact upper limit is dependent on the application and the amount of $M_7C_3$ carbide needs to be tailored to each specific cutting application. The amount of $M_7C_3$ carbide is measured by image analysis on a SEM (Scanning Electron Microscope) cross-section image at high contrast. (Details in the examples). Image analysis should always be performed on a sample free from graphite and pores which can otherwise affect the image analysis. Also, it is relevant to identify the phases that are seen in the image, preferably, if the overall chemical composition is known the phases can be identified.

The exact amount of $M_7C_3$ carbide will vary slightly between the gradient zone and the bulk due to the difference in binder content. However, the aim is to have an even content of $M_7C_3$ carbides throughout the whole microstructure, i.e. they are unaffected by gradient formation.

The cemented carbide further comprises gamma phase, which is a solid solution of cubic carbides and carbonitrides. The gamma phase is formed during sintering from cubic carbides or carbonitrides and WC and can be described as (W,M)C and/or (W,M)(C,N) wherein M is one or more of Ti, Ta, Nb, Hf, Zr, V and Cr, preferably one or more of Ti, Ta, Nb and Cr, most preferably the gamma phase comprises Ti, Ta, Nb and Cr.

The amount of gamma phase, in area % is suitably between 2 to 25%, preferably between 3 to 15%. This can be measured in different ways but one way is to perform an image analysis of either a Light Optical Microscope image or a Scanning Electron Microscope (SEM) micrograph of a cross section of the substrate to calculate the average fraction of gamma phase.

The thickness of the gradient surface zone i.e. the binder phase enriched surface zone depleted from gamma phase is suitably between 2 to 100 μm, preferably between 3 to 70 μm and more preferably 8 to 35 μm. The thickness is determined by measuring on a SEM or LOM image of a cross section of the substrate. Those measurements should be performed in areas where the substrate surface is reasonably flat, i.e. not close to the edge, at least 0.3 mm from the cutting edge, or nose etc. in order to get a true value. The boundary between the surface zone and the bulk is determined by the absence/presence of gamma phase which is usually quite distinct when observing a cross-section of the substrate in a SEM or LOM image. The thickness is determined by the distance between the surface and the boundary between the surface zone and the bulk.

By binder enriched is herein meant that the binder phase content in the surface zone is at least 1.3 times the binder phase content in the bulk. The binder phase content in the surface zone is suitably measured at a depth of half the total thickness/depth of the surface zone. By bulk is herein defined as the area that is not the surface zone. All measurements performed on the bulk should be performed at an area not too close to the surface zone. By that is herein meant that any measurements done to the microstructure of the bulk should be performed at a depth of at least 200 μm from the surface.

By depleted of gamma phase is herein meant that the surface zone contains no, or very few gamma phase particles, i.e. less than 0.5 area %.

The binder phase is suitably selected from one or more of Fe, Co and Ni, preferably Fe and/or Co, most preferably Co. The amount of binder is suitably between 2 to 20 wt % of the sintered body, preferably from 4 to 12 wt %, of the sintered body. The amount of binder is given by the powder weight of the powders forming binder phase that is weighted in before sintering. Although the binder is described to be one or more of Fe, Co and Ni, other elements are also dissolved in the binder. According to the present invention, Cr is present and also one or more of Ti, Ta, Nb, Hf, Zr and V depending on which other constituents are present in the microstructure.

The cemented carbide has suitably a carbon content so that no eta phase or graphite is formed in the microstructure.

The cemented carbide can also comprise other constituents common in the art of cemented carbides. When recycled material (PRZ) is used, Zr, V, Zn, Fe, Ni and Al can also be present in small amounts.

According to the present invention, the cemented carbide insert comprises a wear resistant CVD (Chemical Vapor Deposition) or PVD (Physical Vapor Deposition) coating.

In yet another embodiment of the present invention, the cemented carbide comprises a wear resistant CVD coating.

In yet another embodiment of the present invention, the cemented carbide insert is comprises a wear resistant CVD coating comprising several layers, suitably at least a metal carbonitride layer and a $Al_2O_3$ layer, preferably at least one Ti(C,N) layer and $\alpha$-$Al_2O_3$ and optionally an outer TiN layer.

The coating can also be subjected to additional treatments known in the art, such as brushing, blasting etc.

By cutting tool is herein meant a tool for metal cutting such as an insert, end mill or drill.

In one embodiment of the present invention, the cutting tool is an insert, preferably a turning insert.

The present invention also relates to a method of making a coated cutting tool comprising a cemented carbide substrate as described above. The method comprising the following steps:
providing powders forming hard constituents comprising WC and powders forming gamma phase
providing powders forming the binder phase
providing powders comprising Cr,
providing a milling liquid,
milling, drying, pressing and sintering the powders into a cemented carbide substrate wherein the amount of Cr and C that $M_7C_3$ carbides will be present in the sintered microstructure.

The powders forming hard constituents comprises WC and at least one powder forming gamma phase. The WC powder preferably has an average particle size (FSSS) of between 0.3 to 10 µm, preferably between 0.5 to 6 µm.

The powders forming gamma phase comprises at least one carbide, nitride or carbonitride of Ta, Ti, Nb, Cr, Hf, V and Zr. Also mixed carbides, nitrides or carbonitrides like e.g. (M,W)C or (M,W)(C,N) where M is one or more of Ta, Ti, Nb, Cr, Hf, V and Zr, can be added. Preferably, at least one of the powders forming gamma phase is a nitride or carbonitride.

In one embodiment of the present invention, when a binder phase enriched surface zone depleted from gamma phase is aimed for, nitride and carbonitride components are added. In one embodiment of the present invention, at least one part of the powders forming hard constituents are added as a powder fraction made from recycled cemented carbide scrap, comprising the elements W, C and Co and at least one or more of Ta, Ti, Nb, Cr, Zr, Hf and Mo.

The raw materials forming the binder phase can be added as pure metals, alloys of two or more metals selected from Co, Fe or Ni.

The Cr is usually added as $Cr_3C_2$ powder, however also other Cr-containing powders can be used, metallic or other carbides.

Changing the carbon content in a cemented carbide can be done by either adding carbon black, if an increase in carbon is desired. Or, by adding W, or $W_2C$, if a decrease in carbon is desired. Due to the high additions of Cr, usually in the form of $Cr_3C_2$, as described herein, extra W is added to compensate for the extra carbon that comes with the $Cr_3C_2$. The exact amounts added is up to the skilled person to decide to obtain the desired carbon balance.

Any liquid commonly used as a milling liquid in conventional cemented carbide manufacturing can be used. The milling liquid is preferably water, alcohol or an organic solvent, more preferably water or a water and alcohol mixture and most preferably a water and ethanol mixture. The properties of the slurry are dependent on the amount of milling liquid added. Since the drying of the slurry requires energy, the amount of liquid should be minimized in order to keep costs down. However, enough liquid need to be added in order to achieve a pumpable slurry and avoid clogging of the system. Also, other compounds commonly known in the art can be added to the slurry e.g. dispersion agents, pH-adjusters etc. An organic binder is also optionally added to the slurry in order to facilitate the granulation during the following spray drying operation but also to function as a pressing agent for any following pressing and sintering operations. The organic binder can be any binder commonly used in the art. The organic binder can e.g. be paraffin, polyethylene glycol (PEG), long chain fatty acids etc. The amount of organic binder is suitably between 15 and 25 vol % based on the total dry powder volume, the amount of organic binder is not included in the total dry powder volume.

The slurry comprising powders forming hard constituents and powders forming the binder phase, and possibly an organic binder is suitably mixed by a milling operation, e.g. in a ball mill or attritor mill. The milling is suitably made by first forming a slurry comprising metal binder powder, powders forming hard constituents, and possibly an organic binder. Then the slurry is suitably milled in a ball mill or attritor mill to obtain a homogenous slurry blend. The milling time is up to the person skilled in the art to decide based on the type of mill used, desired WC grain size, the type of raw materials used etc.

The slurry containing the powdered materials mixed with the organic liquid and possibly the organic binder is atomized through an appropriate nozzle in the drying tower where the small drops are instantaneously dried by a stream of hot gas, for instance in a stream of nitrogen, to form agglomerated granules. For small scale experiments, also other drying methods can be used, e.g. pan drying.

Green bodies are subsequently formed from the dried powders/granules by a pressing operation such as uniaxial pressing, multiaxial pressing etc.

The green bodies formed from the powders/granules made according to the present invention, are subsequently sintered according to any conventional sintering method e.g. vacuum sintering, Sinter HIP, spark plasma sintering, gas pressure sintering (GPS) etc.

The sintering temperature is suitably between 1350 and 1550° C.

According to the present invention the cemented carbide substrates are provided with a coating.

In one embodiment of the present invention the cemented carbide substrates made according to the above, are provided with a wear resistant coating using CVD or PVD-technique.

In one embodiment of the present invention a CVD coating is deposited comprising a first TiCN layer deposited by MTCVD and a second $\alpha$-$Al_2O_3$ layer deposited by CVD. Possibly an outermost color layer for wear detection, e.g. a TiN layer, can also be deposited.

The coating can also be subjected to additional treatments, such as brushing, blasting etc.

In one embodiment of the present invention, the coated cutting tool is subjected to a shot peening step.

By "Shot peening" is herein meant that the surface of a cutting tool is bombarded with a media comprising particles, so called beads, that are non-abrasive and that typically have a round shape.

The shot peening is preferably performed in a dry process using air with the beads in it. The beads can be made of any material known in the art of shot peening, such as ceramic beads, cemented carbide beads or metallic beads. In one embodiment of the present invention the shot peening is performed with a peening media comprising beads of $ZrO_2$, steel or cemented carbide.

In one embodiment of the present invention the shot peening is performed with a peening media of an average diameter of 70-150 µm. The impact or energy from the beads during the shot peening should not be too high since this would increase the risk of damaging the surface and the cutting edge of the cutting tool. The impact or energy from the beads should neither be too low since then the technical effect would not be achieved. If the beads are too large the risk of damaging the cutting edge is increased. If the beads are too small the energy and impact transferred from the media to the substrate is less pronounced. A suitable size of the beads is related to the material of the beads and is to be selected by the skilled person.

In one embodiment of the present invention the peening is performed in a shot direction that is perpendicular to the surface of the cutting tool. A perpendicular shot peening is advantageous in that the depth of the impacted substrate is the largest when the heated shot peening is in this direction.

In one embodiment of the present invention the method further comprises a step of shot blasting at least a portion of the cutting tool. Preferably the portion includes at least a section of the cutting edge or an area close to the cutting edge.

By "Shot blasting" is herein denoted a process using abrasive grains wherein material typically is removed from the treated surface by abrasive wear. Shot blasting is well known in the field of cutting tools and is for example known to introduce residual stresses in a coating on a cutting tool.

In one embodiment of the present invention the step of shot blasting is performed subsequent to the shot peening. The heat during the shot peening can reduce some positive effect from the shot blasting, such as residual stress induction in a coating, so by selecting to do the shot peening before the shot blasting both positive effects can be maintained.

In one embodiment of the present invention the shot blasting and the shot peening are performed on the same portions of the cutting tool, preferably on the rake face. This is advantageous for example during a production in large scale due to a more effective loading of the cutting tools.

In one embodiment of the present invention, the coated cutting tool is subjected to a shot peening step performed at an elevated temperature.

In one embodiment of the present invention the shot peening is performed on heated cutting tools, the method comprises a step prior to the shot peening wherein said cutting tools are heated.

The shot peening is then subjected at a temperature of or above 100° C., preferably at a temperature of or above 200° C., more preferably at a temperature of between 200° C. and 450° C. The portion of the substrate that is subjected to shot peening is at said temperature. It has unexpectedly been found that treating a cutting tool to shot peening when it is heated increases its lifetime in cutting.

The shot peening is performed at an elevated temperature, and this temperature is herein defined as the temperature that the material (the portion of the cutting tool) that is shot peened is at during the shot peening. Several methods can be used to create the elevated temperature of the cutting tool portion, such as induction heating, resistance heating, pre-heating on a hot surface/oven, laser heating etc. The cutting tool can alternatively be heated in a separate step prior to the shot peening step.

The upper limit for the temperature where the shot peening is performed preferably below the sintering temperature, more preferably below 1200° C.

The temperature is suitably measured on the substrate by any method suitable for measuring temperature. Preferably, an infrared temperature measurement device is used.

The shot peening process according to the present invention can also be combined with other process steps known in the art of making cutting tools such e.g. brushing, wet blasting etc.

DETAILED DESCRIPTION OF DRAWINGS

In FIG. 1 a SEM image of a cemented carbide microstructure according to the present invention is shown.

Figure 2:
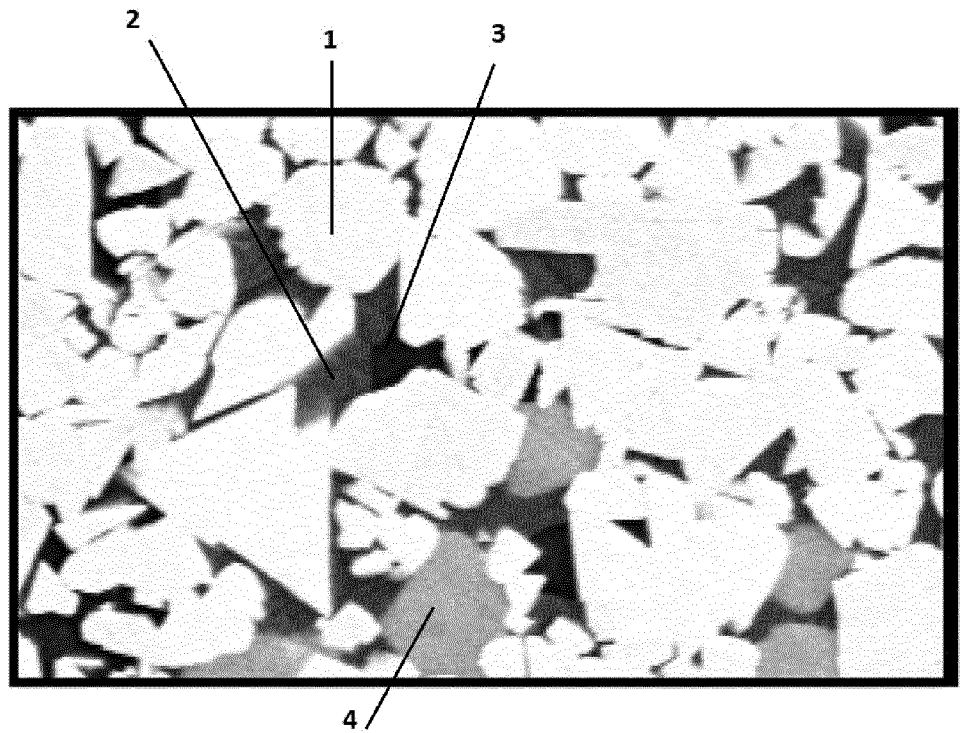

In FIG. 2, a more detailed part of FIG. 1 is shown where 1 is WC, 2 is binder phase, 3 is $M_7C_3$ carbide and 4 is gamma phase.

EXAMPLE 1 (INVENTION)

A coated cutting insert was prepared by first make a cemented carbide substrate from the powders given in Table 1 in weight % and with balance WC having an average particle size (FSSS) of 3±0.5 µm.

TABLE 1

| Co | WC | TaC | $(Ta_{0.8}Nb_{0.2})C$ | $Ti(C_{0.5}N_{0.5})$ | $(Ti_{0.5}W_{0.5})C$ | $Cr_3C_2$ | W |
|---|---|---|---|---|---|---|---|
| 7.82 | 85.63 | 0.52 | 0.71 | 0.28 | 1.09 | 2.71 | 1.23 |

The powders were milled together with a milling liquid (water/ethanol) and an organic binder (PEG) 2 wt % calculated from the total dry powder weight. The formed slurry was then dried, and the dried powder was then subjected to a pressing operation to form a green body.

The green body was then sintered at a temperature of 1450° C. for 1 h/min in vacuum.

The sintered body was studied in a light optical microscope (LOM) and the gradient zone was determined to 35 µm.

When looking at a SEM image of Invention 1 (see FIGS. 1 and 2), $M_7C_3$ carbide was observed both in the surface zone as well as in the bulk. The amount of $M_7C_3$ carbides was determined by image analysis using the software Fiji on a high contrast SEM image of the bulk of the cemented carbide. The $M_7C_3$ carbides were detected as greyscale values from 0 to 50 of the 256 available grey scale values. No visible pores or graphite may be present in the region of interest for accurate measurements to be possible. Noise reduction function "Despeckle" was used before quantification. The amount of $M_7C_3$ carbide was measured as 2.5 area %.

The area fraction of gamma phase was also measured, 8 area %.

The substrate was then coated with a TiCN (9.6 µm)/$Al_2O_3$ (6 µm) CVD coating.

EXAMPLE 2 (COMPARATIVE)

A coated cutting insert was prepared by first prepare a cemented carbide substrate from the raw material powders 7.2 wt % Co, 2.87 wt % TaC, 0.46 wt % NbC, 1.87 wt % TiC and 0.40 wt % TiN and balance WC with an average particle size (FSSS) of 5.5-6.3 µm. Although the particle size of this sample is higher than the particle size in Example 1, the grain size of the actual WC grains will be comparable after milling.

The powders were milled together with a milling liquid (water/ethanol) and an organic binder (PEG) 2 wt % calculated from the total dry powder weight. The formed slurry was then pan dried and the dried powder was then subjected to a pressing operation to form a green body.

The green body was then sintered at a temperature of 1450° C. for 1 h/min in vacuum.

The sintered body was studied in a light optical microscope (LOM) and the first gradient zone was determined to 26 µm.

The area fraction of gamma phase was 11.5 area %.

No $M_7C_3$ carbide was detected.

The substrate was then coated with the same coating process as Invention 1 resulting in a TiCN (8.2 µm)/Al$_2$O$_3$ (5.5 µm) coating.

EXAMPLE 3 (WORKING EXAMPLE)

The inserts according to the Invention (Invention 1) and prior art (Comparative 1) were tested in a longitudinal turning operation in steel (SS1672) under the following working conditions:

Vc: 300 m/min.
f: 0.2 mm/rev
ap: 2.64 mm
Cutting fluid: Yes
Number of cuts: 7 (1 cycle)

Three edges for each variant were tested.

The tool life criterion was Fracture damage edge line ≥50%. The results are shown in Table 2 where the number of cycles is an average of three edges.

TABLE 2

|  | No of cycles |
|---|---|
| Invention 1 | 17.8 |
| Comparative 1 | 11.6 |

It is clearly seen in Table 2 that the insert according to the invention has a considerably improved edge line toughness compared to the comparative insert.

The invention claimed is:

1. A coated cutting tool being a metal cutting turning insert comprising a Cr-containing cemented carbide substrate comprising WC, a binder phase and a gamma phase, wherein the cemented carbide includes a gradient surface zone with a thickness of between 2 to 100 µm, which is binder phase enriched and depleted of gamma phase, wherein the cemented carbide comprises $M_7C_3$ carbides in an amount of between 1.5 to 6 area % measured in a bulk of the substrate, and wherein M is elements comprising Cr, W and at least one binder metal.

2. The coated cutting tool according to claim 1, wherein the $M_7C_3$ carbides is present in both the bulk and the gradient surface zone.

3. The coated cutting tool according to claim 1, wherein the thickness of the surface zone is between 3 to 70 µm.

4. The coated cutting tool according to claim 1, wherein the enriched binder phase comprises a binder phase content in the gradient surface zone that is at least 1.3 times a binder phase content in the bulk.

5. The coated cutting tool according to claim 1, wherein the gamma phase comprises (W,M)C and/or (W,M)(C,N) wherein M is one or more of Ti, Ta, Nb, Hf, Zr, V and Cr.

6. The coated cutting tool according to claim 1, wherein the amount of gamma phase is between 3 to 25 area %.

7. The coated cutting tool according to claim 1, wherein the binder phase content is between 2 to 20 wt %.

8. The coated cutting tool according to claim 1, wherein the coating is a CVD or PVD coating.

9. The coated cutting tool according to claim 1, wherein the coated cutting tool is a turning insert.

10. A method of making a coated cutting tool comprising a cemented carbide substrate according to claim 1 comprising the following steps:
    providing powders forming hard constituents comprising WC and powders forming gamma phase;
    providing powders forming the binder phase;
    providing powders comprising Cr;
    providing a milling liquid;
    milling, drying, pressing and sintering the powders into a cemented carbide substrate; and
    providing the cemented carbide substrate with a coating.

11. The method according to claim 10, wherein at least one of the powders forming gamma phase is a nitride or a carbonitride.

12. The method according to any of claim 1, wherein the coating is a CVD coating.

13. The method according to any of claim 10, wherein the coated cutting tool is subjected to a shot peening step.

14. The method according to claim 13, wherein the shot peening step is performed at a temperature of/or above 100° C.

* * * * *